(12) United States Patent
Chien

(10) Patent No.: US 6,170,958 B1
(45) Date of Patent: Jan. 9, 2001

(54) ELECTRO-LUMINESCENT NIGHT LIGHT HAVING AN IMPROVED HOUSING AND CONNECTOR ARRANGEMENT THEREFOR

(76) Inventor: Tseng-Lu Chien, 8F, No. 29, Alley 73, Lin-Shen Road, Shi-Chi Town, Taipei. Hseng (TW)

( * ) Notice: Under 35 U.S.C. 154(b), the term of this patent shall be extended for 0 days.

(21) Appl. No.: 08/956,425

(22) Filed: Oct. 23, 1997

Related U.S. Application Data

(63) Continuation-in-part of application No. 08/910,202, filed on Aug. 13, 1997, which is a continuation-in-part of application No. 08/383,404, filed on Feb. 3, 1995, now Pat. No. 5,667,394.

(51) Int. Cl.[7] .......................................................... F21V 9/16
(52) U.S. Cl. .................................................. 362/84; 439/86
(58) Field of Search ........................ 439/86, 490; 362/84, 362/226, 95; 40/544

(56) References Cited

U.S. PATENT DOCUMENTS

| | | | |
|---|---|---|---|
| 3,056,897 | * 10/1962 | Knochel et al. ...................... | 313/483 |
| 3,061,716 | * 10/1962 | Benander .............................. | 362/226 |
| 3,780,260 | * 12/1973 | Elsner .................................. | 392/392 |
| 4,343,032 | * 8/1982 | Schwartz .............................. | 362/276 |
| 5,469,342 | 11/1995 | Chien . | |
| 5,481,442 | * 1/1996 | Dickie et al. ........................... | 362/95 |
| 5,572,817 | 11/1996 | Chien . | |
| 5,599,088 | 2/1997 | Chien . | |
| 5,601,358 | 2/1997 | Chien . | |
| 5,611,621 | 3/1997 | Chien . | |
| 5,662,408 | * 9/1997 | Marischen ............................ | 362/226 |
| 5,667,394 | 9/1997 | Chien . | |
| 5,667,736 | 9/1997 | Chien . | |
| 5,670,776 | * 9/1997 | Rothbaum ...................... | 250/214 AL |
| 5,683,164 | 11/1997 | Chien . | |
| 5,704,705 | 1/1998 | Chien . | |
| 5,722,760 | * 3/1998 | Chien ................................... | 362/84 |
| 5,779,346 | * 7/1998 | Burke ................................... | 362/84 |

\* cited by examiner

*Primary Examiner*—Kheim Nguyen
*Assistant Examiner*—Michael C. Zarroli

(57) ABSTRACT

A night light includes an electro-luminescent element connected to an electrical plug by conductive elements compressed between electrodes of the electro-luminescent element and prongs of the electrical plug. The electro-luminescent element is captured between an inner plate and a front part of the housing so as to cause the electro-luminescent element to conform to a curved surface of the housing without the need for additional plastic housing material, the inner plate also serving to apply a biasing force against the conductive elements.

16 Claims, 7 Drawing Sheets

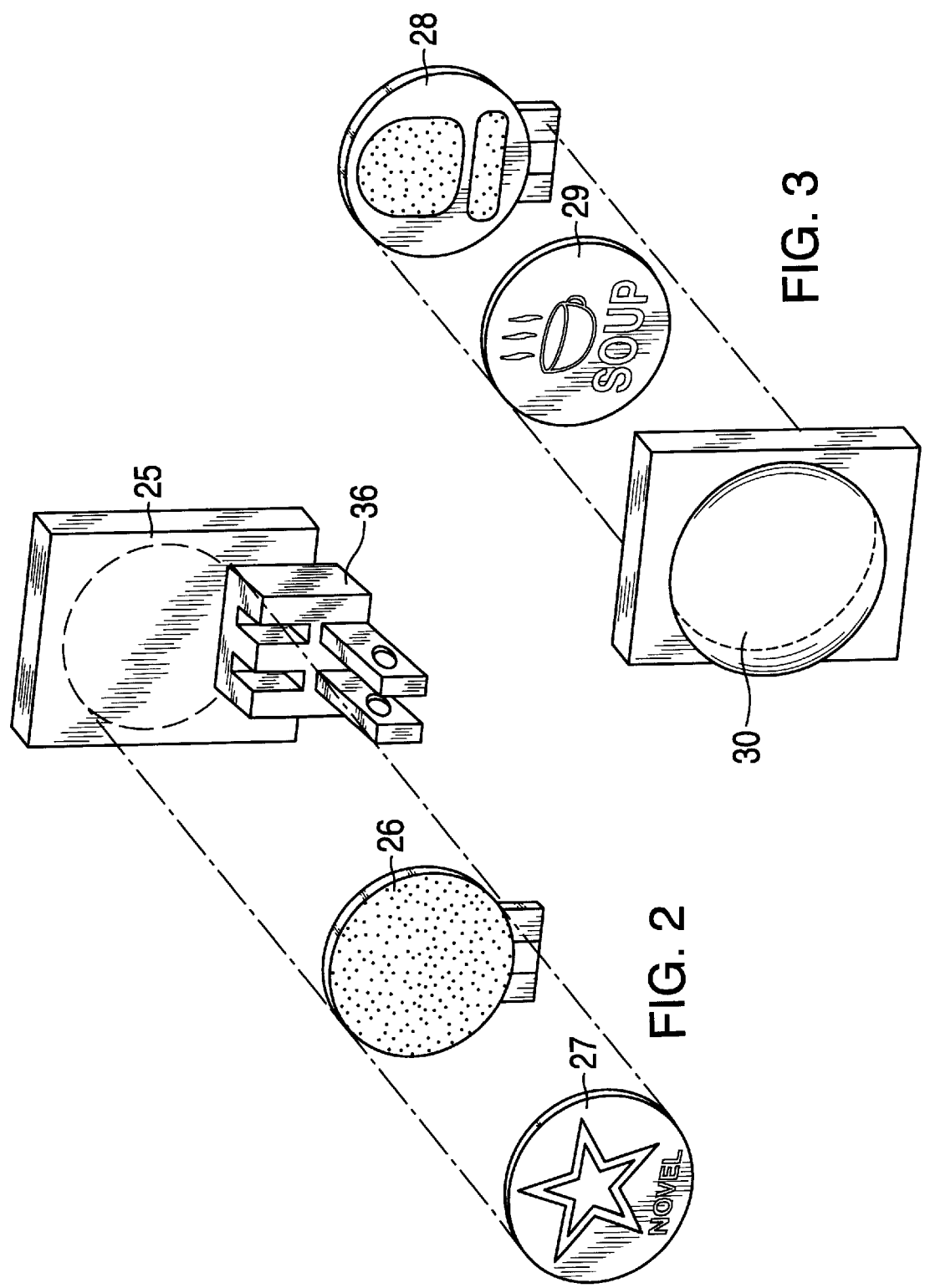

ELECTRO-LUMINESCENT NIGHT LIGHT HAVING AN IMPROVED HOUSING AND CONNECTOR ARRANGEMENT THEREFOR

This application is a continuation-in-part of U.S. patent application Ser. No. 08/910,202, filed Aug. 13, 1997, which is a continuation-in-part of allowed U.S. patent application Ser. No. 08/383,404, filed Feb. 3, 1995, (now U.S. Pat. No. 5,667,394).

BACKGROUND OF THE INVENTION

1. Field of the Invention

This invention relates to an improvement to a night light of the type having an electro-luminescent lighting element, as disclosed in parent U.S. patent application Ser. No. 08/910,202, in which large area electrodes on the electro-luminescent lighting element directly engage a specially designed connection member to facilitate electrical connection of the lighting element to a metal plug. The improvement involves the use of a multiple-piece housing which provides a curved surface while minimizing the amount of plastic required.

2. Discussion of Related Art

The present invention utilizes the basic electro-luminescent lighting fixture connector principles disclosed in copending allowed U.S. patent application Ser. No. 08/383,404, (now U.S. Pat. No. 5,667,394) applied to a night light of the type disclosed in parent U.S. patent application Ser. No. 08/910,202, by utilizing a non-penetrative contact arrangement which limits damage to the electro-luminescent element(s) used in the night light and reduces the risk of electrical shocks and short circuits, and in addition addresses a problem with prior electro-luminescent night lights, such as the one disclosed in U.S. Pat. No. 5,662,408, that if the two-piece housing of the prior night lights is designed with a curved electro-luminescent panel, so as to provide a greater viewing angle and a more attractive housing configuration, while still providing a flat back surface to permit the night light to be flush with an electrical outlet when plugged in, the amount of plastic material required by the back piece of the housing must be increased in order to provide the necessary curved electro-luminescent element supporting surface. As a result, the prior two-piece housing construction is not practical for an electro-luminescent night light having a curved surface.

Except for the arrangement of the housing, the night light of the present invention is similar to that disclosed in the parent application. Since the advantages of the non-penetrative or sandwich type contact termination arrangement are described in detail in the parent application, they will not be repeated herein, except to note that non-penetrative contact termination, and in particular the use of resilient conductive members to provide the electrical connection between the prongs and large area electrodes provided on the surface of the electro-luminescent element, serves to simplify assembly and tooling by increasing the tolerances necessary to effect a good electrical connection, while increasing reliability and decreases risks of short-circuiting or electrical shock hazards.

The only prior disclosure of non-penetrative contact techniques to an electro-luminescent night light known to the Inventor is found in the above-cited U.S. Pat. No. 5,662,408, issued on Sep. 2, 1997. This patent discloses a low profile night light which relies on direct engagement between the outlet prongs and terminals extending from the electro-luminescent element.

While in one embodiment, shims are used to bias the prongs against the terminals, with the terminals being positioned between the shims and the terminals, none of the embodiments uses resilient conductive elements positioned between the prongs and large area terminals or electrodes on the surface of the electro-luminescent element, as in the present invention or that described in the parent application. As a result, in addition to failing to provide a practical way to support the electro-luminescent element to provide a curved surface, the night light disclosed in U.S. Pat. No. 5,662,408 provides a less secure higher impedance electrical connection, greater risk of short-circuits and electrical shock, and decreased assembly tolerances, particularly in view of the delicate nature of the terminal extensions required to effect the electrical connection to the outlet prongs.

SUMMARY OF THE INVENTION

It is accordingly an objective of the invention to provide a night light utilizing an electro-luminescent element having simplified assembly, low materials costs, increased reliability, and a reduced risk of short circuits and electric shock, and which includes a housing having a curved surface for enhanced visibility and a more attractive configuration.

This objective of the invention is achieved, in accordance with the principles of a preferred embodiment of the invention, by providing a night light in which an electrical connection between electrodes on the electro-luminescent element and a source of electric power is optionally provided by resilient conductive elements which provide a self-biased electrical connection to the electrodes without the need for penetrative elements or movable elements, and which includes, in an especially preferred embodiment of the invention, a two-part housing, at least one part being curved, and at least one intermediate housing member in the form of at least one inner plate, the inner plate serving as a fixture means for causing the electro-luminescent element to maintain a curved shape, supporting the plug assembly, and biasing the prongs of the plug assembly against conductive members which serve to ensure a good electrical connection between the prongs and contacts on the electro-luminescent element.

BRIEF DESCRIPTION OF THE DRAWINGS

FIG. 2 is an exploded perspective view showing a variation of the night light illustrated in FIG. 1.

FIG. 3 is an exploded perspective view of an electro-luminescent light assembly suitable for use in the night lights of FIGS. 1 and 2.

DETAILED DESCRIPTION OF THE PREFERRED EMBODIMENTS

Figure 1:
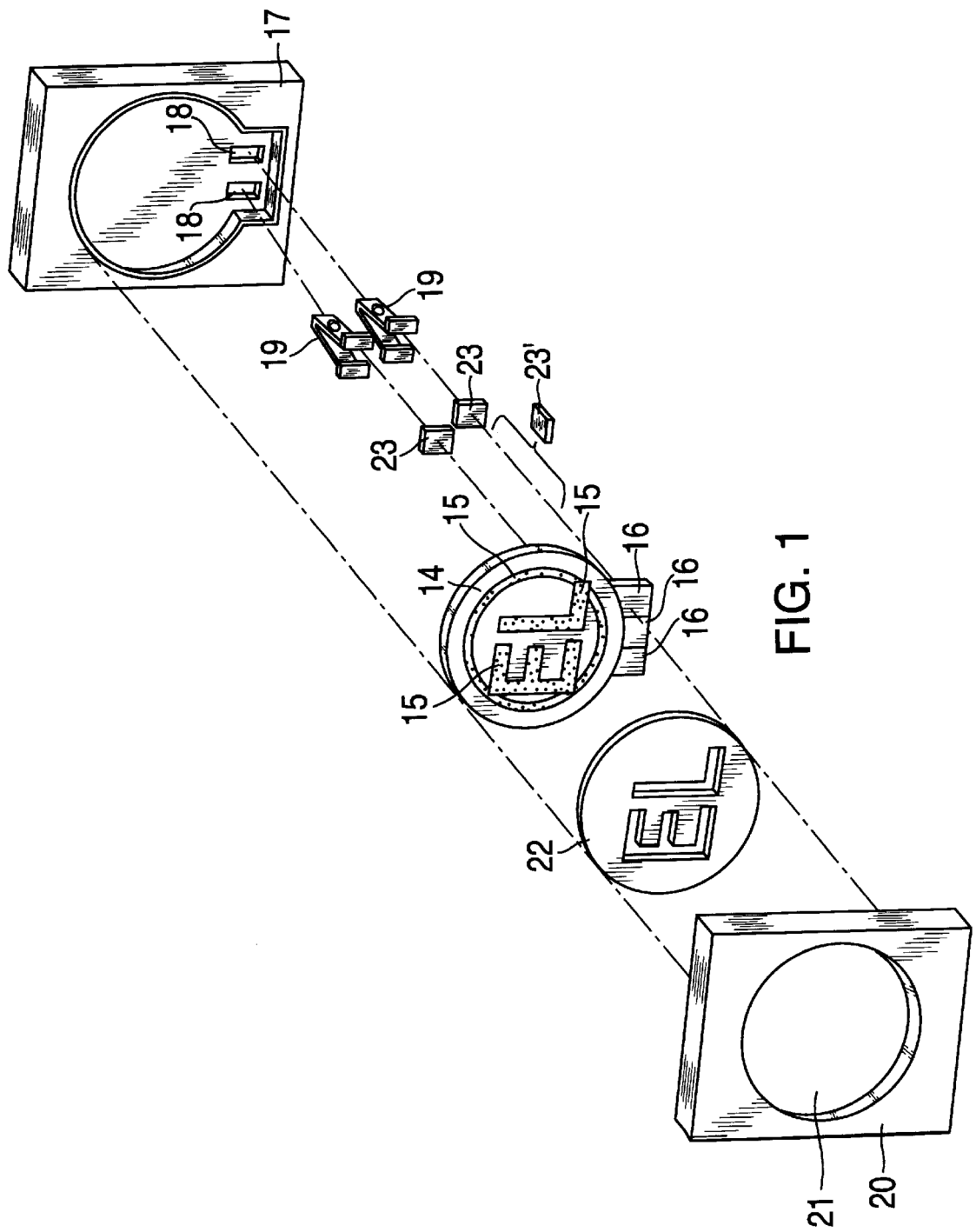
FIG. 1 is an exploded perspective view illustrated the basic principle of utilizing a non-penetrative contact arrangement in a night light.
Figure 5:
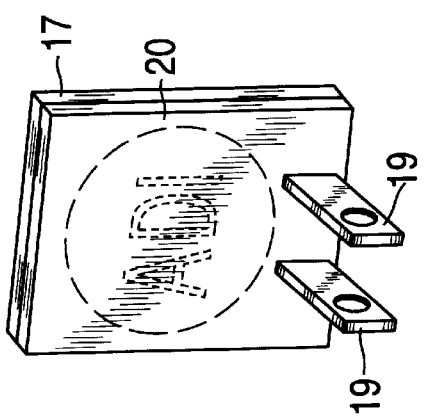
FIG. 5 is a perspective view of an assembled night light corresponding to the night lights illustrated in FIGS. 1 and 4.
Figure 4:
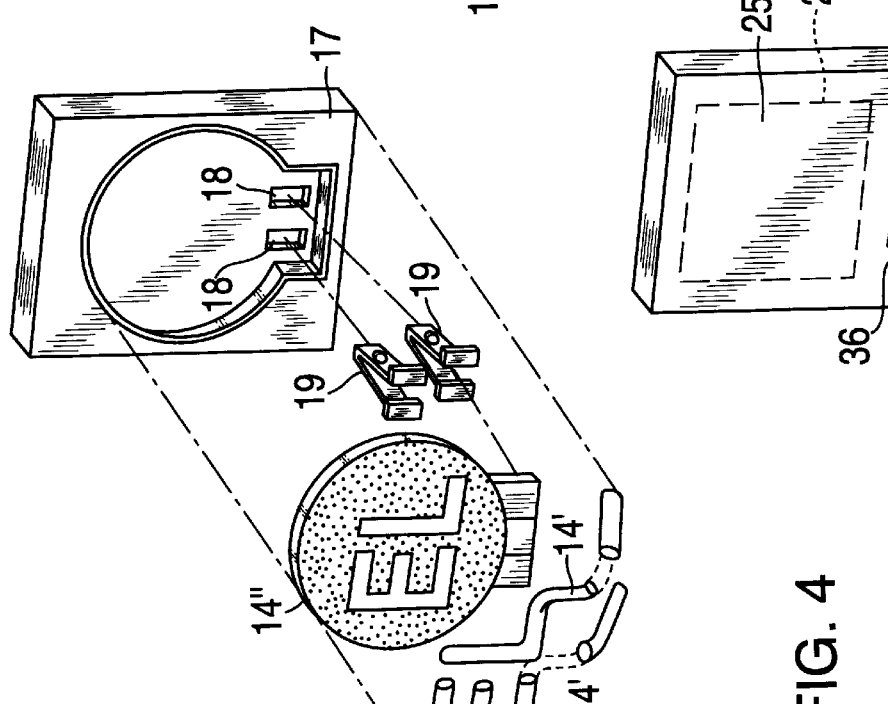
FIG. 4 is an exploded perspective view of a further variation of the night lights illustrated in FIGS. 1 and 2.

As illustrated in FIG. 1, a night light constructed in accordance with the principles described in the parent application, and which is disclosed herein in order to illustrate the basic connector arrangement used by the present invention, includes an electro-luminescent element 14 made up of multiple phosphor segments 15 and electrode contact areas 16 (which are actually on the rear side of elements 16 extending from panel 14). The housing for the night light includes a rear section 17 containing an indentation for receiving the electro-luminescent element 14 and openings 18 for prongs 19, and a front section 20 having an opening or window 21 through which the electro-luminescent element is to be viewed. An optional frontsheet 22 may be positioned between the electro-luminescent element 14 and window 21.

In order to greatly simplify assembly of the night light of FIG. 1, contact areas 16 and prongs 19 are electrically connected together by means of resilient conductive elements 23 which are compressed between the contact areas and prongs when the housing is assembled together. Compression of the conductive elements 23 ensures that electrical continuity between the electrodes of the electro-luminescent element and the prongs is maintained, with the resilience of the conductive elements also compensating for tolerances in the construction of the prongs or contact areas of the electrodes of the electro-luminescent element, for example in the case where the prongs and electrodes have facing surfaces that are not completely parallel, or not completely flat.

The conductive elements 23 may be in the form of flexible or elastic conductive rubber elements, or conductive elements of similarly flexible and conductive plastic or metal material. Prongs 19 are UL-listed standard plugs, or equivalent plugs arranged to meet the requirements of countries other than the United States.

Preferably, rear housing section 17 and front housing section 20 are sealed together to prevent the night light from being opened and the electrical connections exposed. As will be explained in more detail below, additional housing pieces such as an inner plate can also be added for this purpose. The indentation in which the electro-luminescent element is received may of course have any desired configuration, or may be eliminated in favor of alternative electro-luminescent element holding means, and the means by which the housing sections are held together and/or sealed may include any suitable holding or sealing means, including glue, double-sided tape, press-fit posts, screws, melting, ultra-sonic sealing, hot melt adhesives, etc., resulting in an attractive and compact night light assembly similar to the one illustrated in FIG. 9.

The electro-luminescent panel 14 may be of the type disclosed in U.S. Pat. No. 5,572,817 and copending U.S. patent application Ser. No. 08/729,408 (now U.S. Pat. No. 5,752,337), Ser. No. 08/734,872 (now U.S. Pat. No. 5,883, 508), and Ser. No. 08/746,706 (now U.S. Pat. No. 5,806, 960), in which attractive designs are obtained by including logos, figures, cartoon characters, words, on either the frontsheet 22 or the electro-luminescent element itself, either by printing, silk-screening, stencilling, or the like, and/or by appropriately arranging the phosphor segments of the electro-luminescent element. Alternatively, or in addition to electro-luminescent panel 14 the night light may include a three-dimensional tube 14' arranged in an attractive pattern in the manner described in copending U.S. patent application Ser. No. 08/758,393. In the embodiment illustrated in FIG. 8, for example, a single color panel 14" provides background for the illumination effect provided by the three-dimensional electro-luminescent element 14', the other elements of the night light being the same as described in connection with FIG. 1, except that additional conductive resilient elements, for example having the configuration illustrated in parent U.S. patent application Ser. No. 08/383, 404 (now U.S. Pat. No. 5,667,394), must be included in order to provide the necessary electrical connections. Further details of either the electro-luminescent panel or three-dimensional electro-luminescent element may be found in the above-cited patent and patent applications.

While in the arrangement of FIG. 1, the electro-luminescent panel is directly connected to the prongs of the night light outlet, it is also within the scope of the invention to use conductive member(s) 23' to connect one or more electrodes of the panel to an inverter, control circuit, function interface, or the like, which can be in the form of a conventional circuit or an integrated circuit. Numerous suitable circuits are known and it is intended that the invention encompass any circuitry to which the electro-luminescent element might be connected, or no circuitry at all, with the electrodes of the electro-luminescent element being directly and exclusively connected to the prongs of the night light. By circuitry is meant any electrical component, including wires, resistors, capacitors, transistors, inductors, and so forth, as well as switches such as the illustrated photo-sensor 27.

Figure 6:
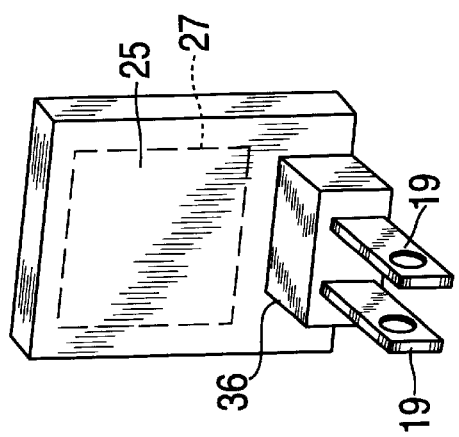
FIG. 6 is a perspective view of an assembled night light corresponding to the night light of FIG. 2.

As shown in FIGS. 2 and 6, for example, the additional circuitry might be housed in an extension 36 of the rear housing member 25. FIG. 2 also illustrates the variation in which the electro-luminescent element 26 does not have multiple segments, the decorative pattern being obtained instead by appropriate decoration of the frontsheet 27.

Alternatively, in the variation shown in FIG. 3, the effects obtained by electro-luminescent element 28 and frontsheet 29 are enhanced by including an optical effects device 30 similar to the one described in copending U.S. patent application Ser. No. 08/841,624 and its parent U.S. patent application Ser. No. 08/489,160 (now abandoned), in which the image of the electro-luminescent element is enhanced by passage through a transparent transmission medium such as water, a gel, a solid transparent medium, epoxy, silicone, PVC, PC, acrylic, or the like to increase the apparent brightness of the element. The optical device can form a convex or concave lens, and can magnify the image, change the image location, change the focus, or change the color of emitted light in a simple and inexpensive yet effective manner.

Figure 7:
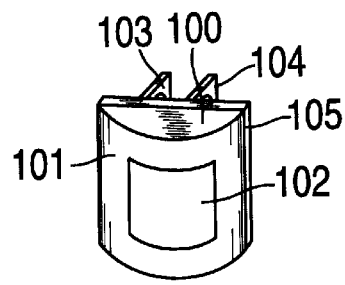
FIG. 7 is a perspective front view of a night light which utilizes the principles illustrated in FIGS. 1–6, but which incorporates a curved surface in accordance with the principles of an especially preferred embodiment of the invention.

The principles illustrated in FIGS. 1–6 are applied to a night light having a curved surface, as follows:

As illustrated in FIG. 7, the night light of the especially preferred embodiment of the invention differs from the night lights illustrated in FIGS. 1–6 in that, instead of a planar front surface, the front housing part 100 includes a curved surface 101 having a window or opening 102 through which one or more electro-luminescent elements may be viewed, with prongs 103 and 104 extending from a rear housing 105 and connected by means illustrated in FIGS. 8–11 to the electro-luminescent elements. In order to support an electro-luminescent element behind window or opening 102, and also support prongs 103 and 104 and bias them relative to electrodes on the electro-luminescent element, the invention provides an additional housing piece, hereinafter referred to as an inner plate (not shown in FIG. 7, but illustrated as element 107 in FIGS. 8–10). It will be appreciated that other terms such as press-board would also be descriptive of the inner plate, and that members other than plates or boards could also be substituted in order to perform the same function.

Figure 8:
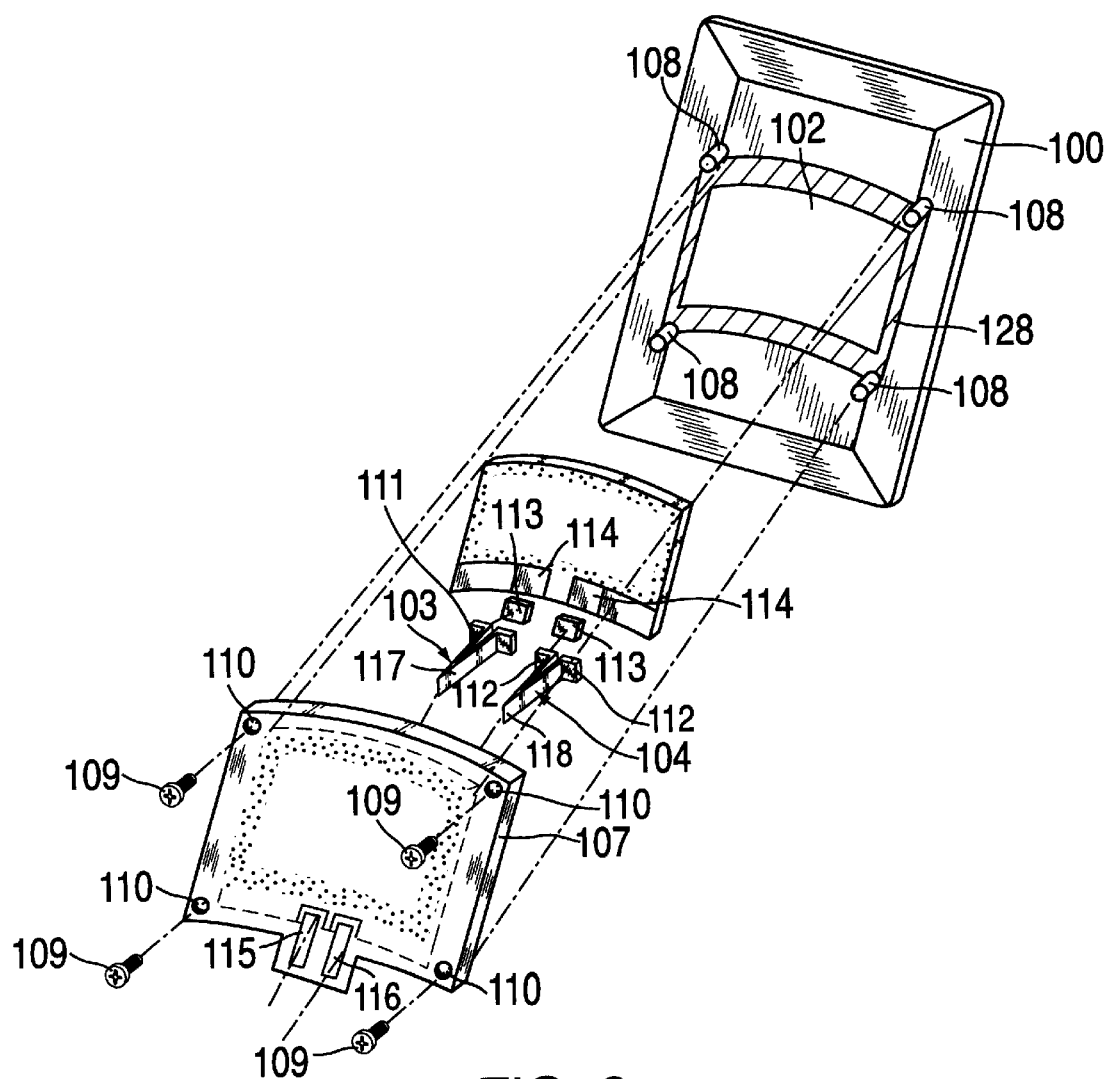
FIG. 8 is an exploded perspective rear view of a front portion of the night light illustrated in FIG. 7.

FIG. 8 illustrates the assembly of the front portion of the night light shown in FIG. 7. In this embodiment, the electro-luminescent element 106, which may include any of the electro-luminescent elements disclosed in the prior patent documents cited above so long as they are sufficiently flexible to conform to the curved surface 101 of housing part 100, is pressed flush against the rear of the front housing part by an inner plate 107 and positioned between posts 108 so as to be visible through window or opening 102. The dimensions of window or opening are such that at least a portion of the electro-luminescent element extends beyond the edges of the window or opening to be supported by the front housing part in the area 128 denoted in FIG. 8 by hatching.

Pressing of the electro-luminescent element 106 against the front housing part 100 is accomplished by securing the inner plate 107 to the front housing part, with the electro-luminescent element sandwiched between the front surface of the inner plate and the rear surface of the front housing part using screws 109 or other fastening means, which pass through openings 110 and are threaded into posts 108. While it is within the scope of the invention to secure the inner plate to the front housing by fasteners other than screws, such as an adhesive fastener, the use of screws is particularly advantageous because it permits the inner plate 107 to be disassembled from the front housing in order to replace a defective or damaged lighting element.

The inner plate 107 serves not only to press the electro-luminescent element against the front housing part 100, but also to bias contact extensions 111 and 112 of prongs 103 and 104 against respective resilient conductive elements 113 and thereby bias the conductive elements against large area electrodes 114 on the electro-luminescent element in order to establish an electrical connection between the prongs and the electrodes. This is accomplished by providing slots 115 and 116 in the inner plate having an area sufficient to allow passage of the rear portions 117 and 118 of the prongs, but not of the contact extensions 111 and 112, which as a result are engaged by the front surface of the inner plate and pressed against the resilient conductive elements 113 upon securing the inner plate to the front housing part. As a result, the arrangement of this embodiment greatly reduces the required thickness of the back housing piece and reduces the overall weight of the night light, and in addition permits the prong length from the back housing to the inner plate to be varied so that other devices can be connected, such as a power fail switching circuit or other functional components.

Figure 9:
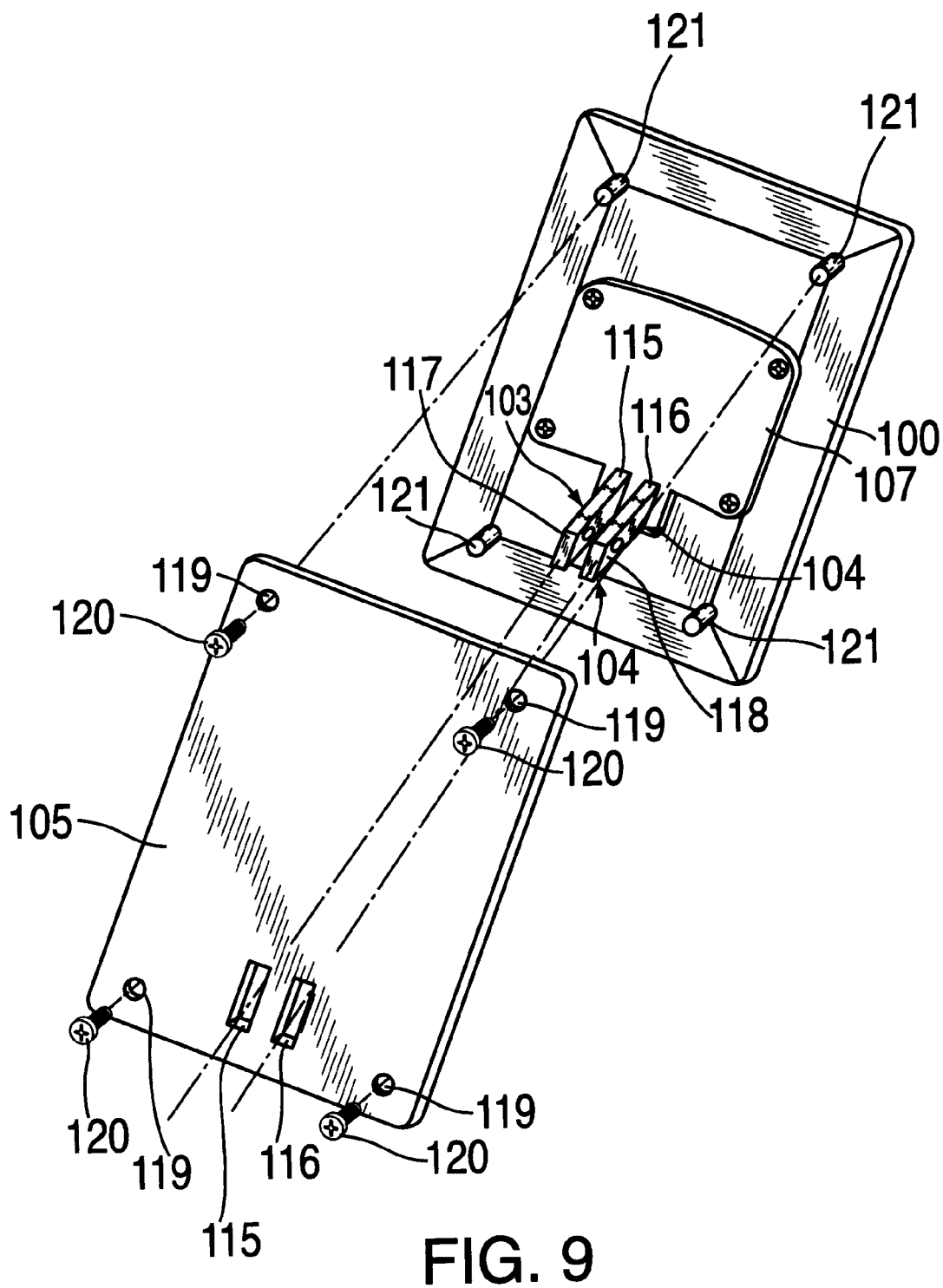
FIG. 9 is an exploded perspective rear view showing both the front and rear portions of the night light illustrated in FIG. 7.

As illustrated in FIG. 9, the housing of this preferred embodiment of the invention is completed by securing rear housing part 105 to the front housing part 100 following attachment of the inner plate 107 to thereby capture the electro-luminescent element 106 and press the contact extensions 111 and 112 of prongs 103 and 104 against resilient conductive elements 113, in turn pressing resilient conductive elements 113 against electrodes 114 of the electro-luminescent element. Rear housing part 105 includes, in this embodiment, slots 119 and 120 through which rear portions 117 and 118 of prongs 103 and 104 extend to the exterior of the housing for engagement with contacts of a standard electrical outlet, and openings 119 for screws 120 which are used to removably fasten the rear housing part to the front housing part by means of threaded posts 121 in the front housing part (these posts are omitted from FIG. 8). As with the screws 109, it is within the scope of the invention to substitute other fastening means, including adhesive fasteners, but screws are especially preferred because they enable disassembly of the night light in order to replace defective or damaged electro-luminescent elements.

Figure 10:
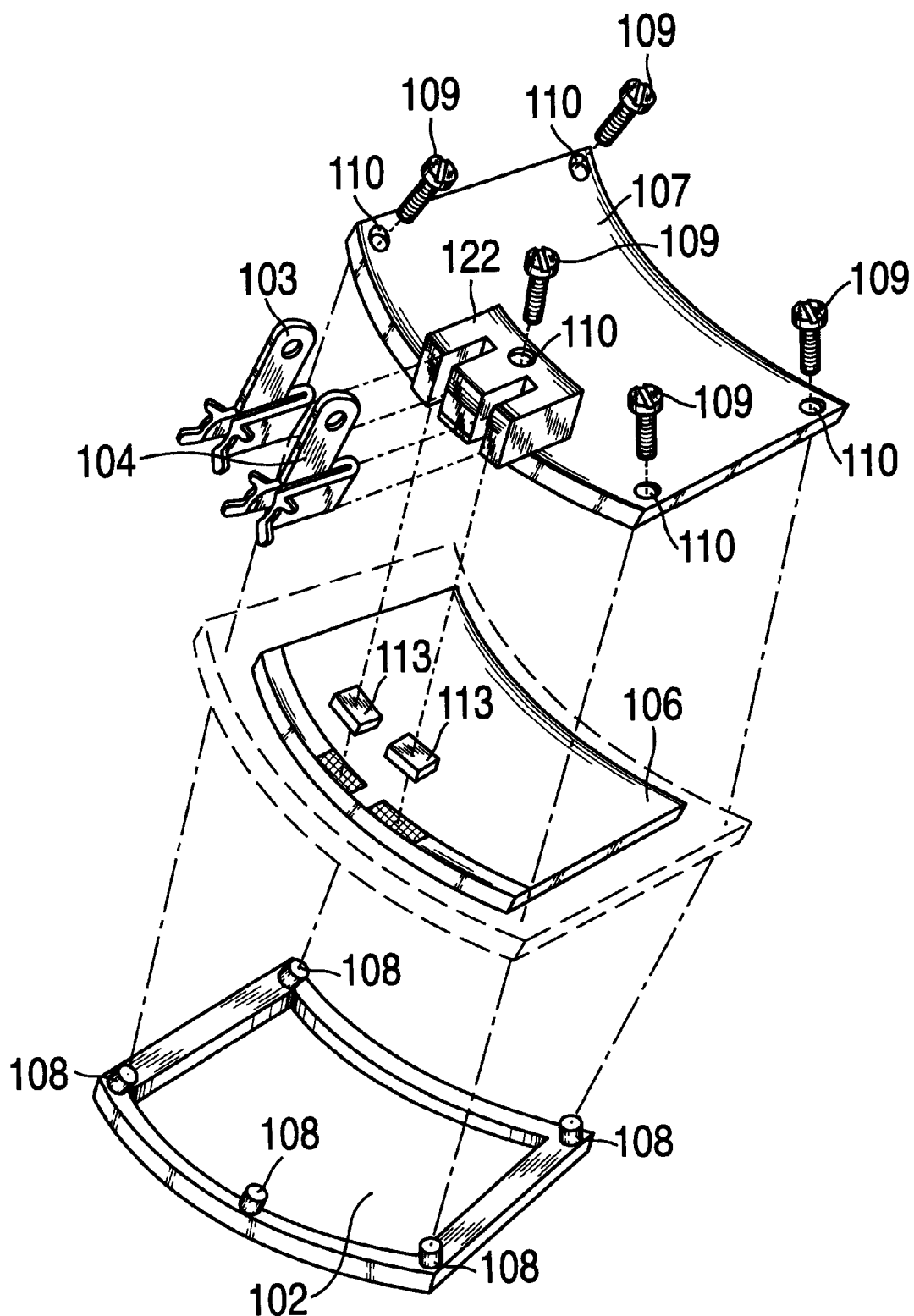
FIG. 10 is an exploded perspective rear view of a variation of the night light illustrated in FIG. 7.

In the variation of the especially preferred embodiment of the invention illustrated in FIG. 10, the electro-luminescent element is indirectly connected to the prongs of the night light outlet by circuitry housed within an extension or attachment 122 to the inner plate 107 in a manner similar to that illustrated in FIGS. 2 and 6. Again, the circuitry can be in the form of one or more elements selected from the group consisting of an inverter, control circuit, function interface, or the like, which can be in the form of a conventional analog or digital circuit, or an integrated circuit, numerous examples of which are known, the extension or attachment 122 including appropriate terminals or contacts for engaging the 103 and 104 and respective conductive members 113 in order to establish an electrical connection therewith. Of course, the embodiments illustrated in FIGS. 7–10 can also be used with an optical effects device similar to device 30 illustrated in FIG. 3 and described above.

Figure 11:
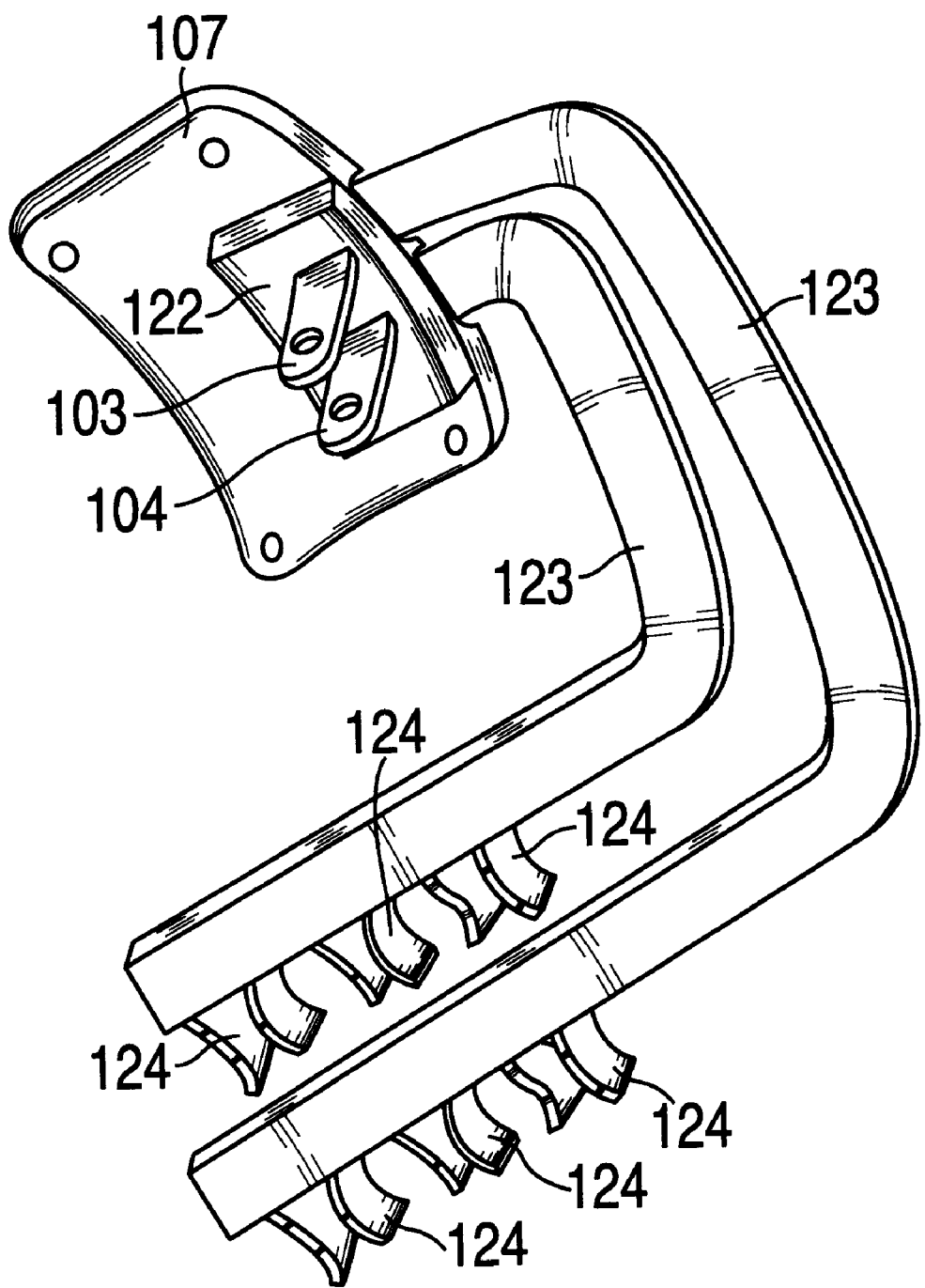
FIG. 11 is a perspective view of a variation of the contact arrangement utilized in the night lights of FIGS. 7–10.

The contact arrangement shown in FIGS. 7–10 may be modified to provide additional receptacles in the manner described in copending application Ser. No. 08/925,122, filed Sep. 8, 1997, and incorporated herein by reference. An example of a multiple receptacle contact arrangement is illustrated in FIG. 11, in which the prongs are connected to, or integral with, conductive strips 123 and 124, which in turn are provided with multiple receptacle contacts 125.

Finally, it will be appreciated by those skilled in the art that the front housing may include decorations or design features in addition to the illustrated simple curved surface, and that additional pieces may be added to the front housing part 100 in order to enhance the design.

Having thus described a preferred embodiment of the invention and a number of different variations and modifications of the preferred embodiment, it is anticipated that still further variations and modifications will undoubtedly occur to those skilled in the art upon reading the above description, and it is therefore intended that the invention be interpreted solely in accordance with the appended claims.

I claim:

1. A night light, comprising:
   at least one electro-luminescent element having electrodes;
   a plug having at least two prongs for connection to a power source;
   conductive means having a first surface in contact with said electrodes and a second surface in contact with said prongs;
   a housing in which said electro-luminescent element, prongs, and conductive means are housed, said housing including at least a front part and a rear part; and
   at least one of fixing means for arranging the electro-luminescent element in the housing and for contacting said prongs with electrodes by conductive means, said fixing means being secured to one of the housing parts, the electro-luminescent element is captured between the fixing means and housing.

2. A night light as claimed in claim 1, wherein said electro-luminescent element is a thin electro-luminescent panel having correspondingly thin electrodes in contact with said conductive means.

3. A night light as claimed in claim 1, wherein said electro-luminescent element is a three-dimensional electro-luminescent fiber element.

4. A night light as claimed in claim 1, wherein the conductive means is made from a resilient material.

5. A night light as claimed in claim 1, wherein the fixing means is an inner plate which is additional piece arranged inside the housing.

6. A night light as claimed in claim 5, wherein said inner plate is removably secured by tightness snap fit.

7. A night light as claimed in claim 5, wherein said inner plate is removably secured to said housing parts by screws.

8. A night light as claimed in claim 7, wherein said screws are threaded into posts on housing, said posts also serving to position the electro-luminescent element relative to a lit area in the housing part so as to be visible therethrough.

9. A night light as claimed in claim 1, wherein said front housing part has a curved principal surface.

10. A night light as claimed in claim 1, further comprising an optical effects device arranged to vary an image of the electro-luminescent element and any stenciling or other indicia as perceived by a person viewing the night light.

11. A night light as claimed in claim 1, further comprising an inverter circuit arranged to increase a brightness, provide other lighting functions, or vary a color of the electro-luminescent element.

12. A night light as claimed in claim 11, wherein the inverter circuit includes function interface means in the form of a conventional circuit arranged to provide lighting functions selected from the group consisting of chasing, random, fade in-out, pair flashing, time setting, time period control, and day-night control.

13. A night light as claimed in claim 1, further comprising means for providing lighting functions selected from the group consisting of chasing, random, fade in-out, pair flashing, time setting, time period control, and day-night control.

14. A night light as claimed in claim 1, wherein the electro-luminescent element having a plurality of phosphor coated areas.

15. A night light as claimed in claim 1, wherein said rear housing part and said front housing part are secured to each other by screws.

16. A night light as claimed in claim 1, further including decorative elements selected from the group consisting of stencilling, phosphor arrangements, discrete electro-luminescent elements, silk-screening, films, filters, and masking.

* * * * *